(12) United States Patent
Washino et al.

(10) Patent No.: US 7,203,069 B2
(45) Date of Patent: Apr. 10, 2007

(54) COMPUTER CARD

(75) Inventors: Kiyoshi Washino, Yokohama (JP); Satoru Kihira, Yokohama (JP); Hiroshi Fukuzaki, Yokohama (JP); Tsuyoshi Fukami, Yokohama (JP); Masato Kato, Yokohama (JP); Yoichi Kasamaru, Yokohama (JP); Yuki Morita, Yokohama (JP); Masaharu Takai, Yokohama (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 152 days.

(21) Appl. No.: 11/002,516

(22) Filed: Dec. 2, 2004

(65) Prior Publication Data

US 2006/0007642 A1     Jan. 12, 2006

(30) Foreign Application Priority Data

Dec. 5, 2003    (JP) .............................. 2003-407831

(51) Int. Cl.
H05K 1/14     (2006.01)
H05K 5/00     (2006.01)
H02B 1/00     (2006.01)

(52) U.S. Cl. ..................... 361/737; 361/600; 361/679

(58) Field of Classification Search ................ 361/784, 361/789, 803, 600, 679, 728, 736, 737; 174/254; 345/206; 349/150
See application file for complete search history.

(56) References Cited

U.S. PATENT DOCUMENTS 5,771,741 A * 6/1998 Roy et al. ...................... 73/167
6,307,753 B1 * 10/2001 Baginy et al. ............. 361/796
6,337,797 B1 * 1/2002 Huang ........................ 361/737
6,552,915 B2 * 4/2003 Takahashi et al. .......... 361/796
6,559,370 B1 * 5/2003 Barker ....................... 114/20.2
6,568,309 B2 * 5/2003 MacLeod .................... 89/1.81
6,992,657 B2 * 1/2006 Huang et al. ................ 345/168

FOREIGN PATENT DOCUMENTS

JP          11-099799          4/1999
JP          2003-091706        3/2003

* cited by examiner

*Primary Examiner*—Tuan Dinh
*Assistant Examiner*—Abiy Getachew
(74) *Attorney, Agent, or Firm*—Jordan and Hamburg LLP

(57) ABSTRACT

A PC card can reduces possibility of the lid being detached from the extended portion even when twisting stress, bending stress, etc. is applied against the PC card, and simplifies the metal mold for resin molding. In the PC card, by placing a lid so as to face an extended portion in such a way that catches provided on the lid are evaded from the catches provided on the extended portion, and thereafter sliding the lid relatively against the extended portion in parallel with the insertion direction to the electronic apparatus, the catches on the lid and the catches on the extended portion become aligned in the height direction, and thereby the lid is fixed to the extended portion.

10 Claims, 5 Drawing Sheets

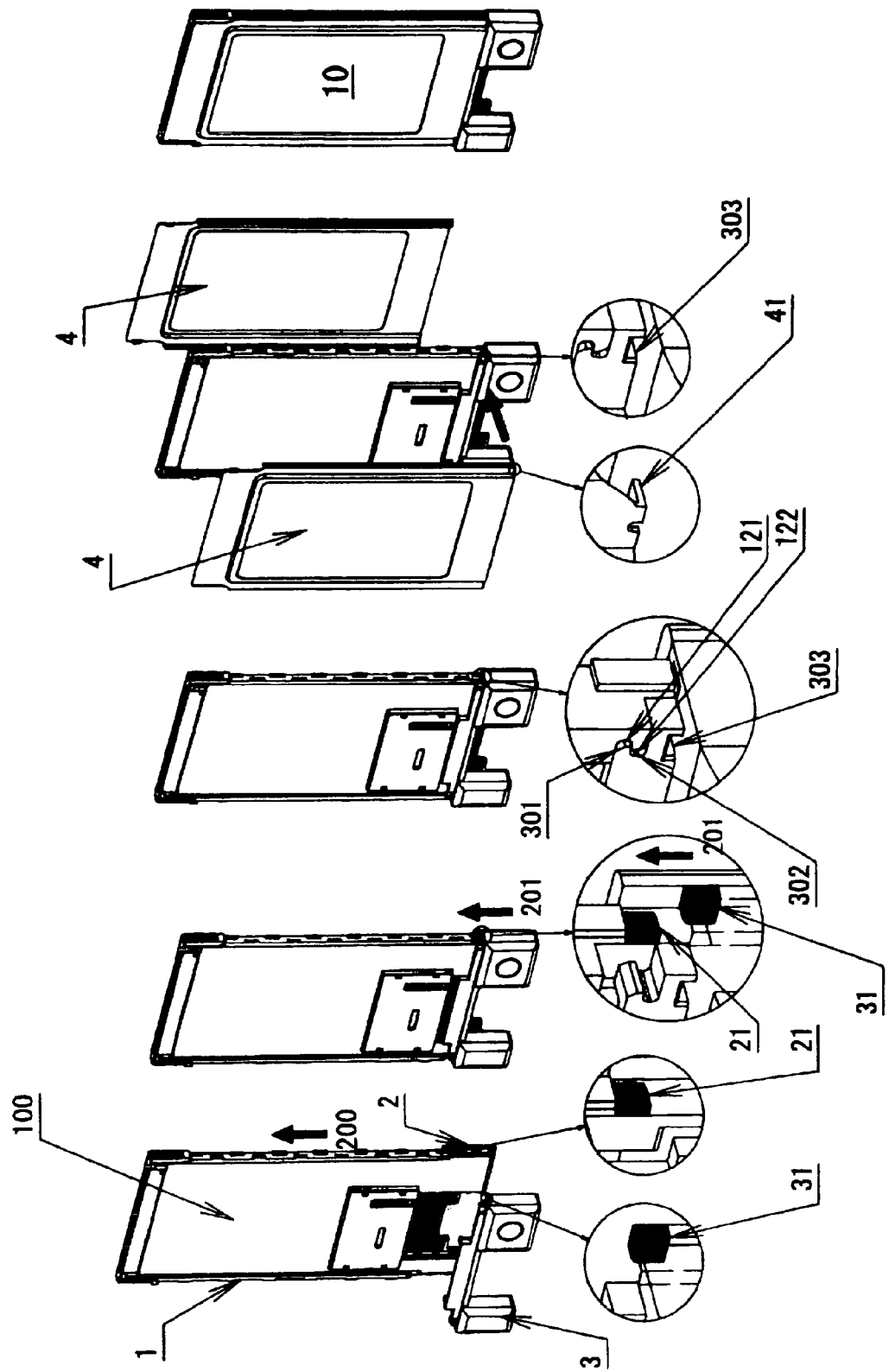

COMPUTER CARD

BACKGROUND OF THE INVENTION

1. Field of the Invention

The present invention relates to a computer card (hereafter referred to as PC card) to be inserted into an electronic apparatus such as a personal computer, in order to add a variety of functions performed through electric connection, and more specifically a PC card having an extended portion externally extended from the electronic apparatus when the PC card is inserted.

2. Description of the Related Art

FIGS. 1A, 1B show exploded views of an example of the conventional PC card. In FIGS. 1A, 1B, the exploded views depict one face and the other face of the PC card, respectively. A main portion of the PC card is constituted of portions, which are referred to as a frame body 1 and an extended portion 2 extended from frame body 1.

In FIGS. 1A, 1B, a circuit board having circuit components accommodated in frame body 1 and extended portion 2 is not shown. On the circuit board, a connector is disposed on the right-hand side in the figure, for electrically connecting to the electronic apparatus when the card is inserted into the electronic apparatus.

Extended portion 2 is further structured of a lid 3 to be covered therewith. FIGS. 2A, 2B and 2C show diagrams for explaining the combined extended portion 2 with lid 3. Both extended portion 2 and lid 3 are formed of synthetic resin. As an example of the conventional structure, the combination of lid 3 with extended portion 2 is structured as shown in FIGS. 2A, 2B and 2C.

FIG. 2A is a plan view of a conventional PC card 10 of completed assembly, including main portion 1 and extended portion 2. Extended portion 2 is covered with lid 3, while main portion 1 is covered with a decorative panel 4. The card is inserted to the electronic apparatus from the side opposite to extended portion 2. Electric connection is made through connector pins provided at an end portion 11. The connector pins are connected to the connector of the electronic apparatus.

FIG. 2B shows assembly procedure steps for assembling extended portion 2, which are illustrated by the cross section along an X—X line, respectively. FIG. 2C shows partial enlarged views each corresponding to each procedure step shown in FIG. 2B.

Namely, in FIGS. 2A, 2B, 2C, the card has a structure such that lid 3 covers extended portion 2, as shown in the procedure step (a). Extended portion 2 and lid 3 are formed of synthetic resin, respectively having locking pieces 2-1, 3-1 of hook shape disposed on the opposite side walls. Locking piece 2-1 disposed on extended portion 2 has a hook of which hollow faces outward, while locking piece 3-1 has a hook of which hollow faces inward.

Further, the above-mentioned locking piece 3-1 has a thinner wall to the extent that locking piece 3-1 is deformed more easily than locking piece 2-1. Therefore, when lid 3 is depressed onto extended portion 2, locking piece 3-1 is deformed outward at the time locking piece 3-1 is hit to locking piece 2-1, as shown in (b), (c) of FIG. 2C. When lid 3 is further depressed, the top of the hook of the locking piece 3-1 falls in the hollow of the hook of locking piece 2-1, by which the shape of locking piece 2-1 is restored. With this, the hook of the locking piece 2-1 is engaged with the hook of locking piece 3-1, which forms a locked state. By lid 3 secured to extended portion 2, the internal circuits are protected.

Therefore, in the conventional configuration shown in FIGS. 1 and 2A to 2C, deformation of lid 3 is inevitably produced when lid 3 is integrated with extended portion 2. Moreover, when handling PC card 10, stresses such as twisting and bending are applied with considerable possibility. Undesirably, this may cause lid 3 to be detached from extended portion 2 with large possibility.

Further, since both locking piece 2-1 of extended portion 2 and locking piece 3-1 of lid 3 are of hook shape, the metal molds for resin molding are of complicated structure. This is disadvantageous to the manufacturing cost.

Meanwhile, commonly to the above points, a variety of PC cards particularly having a feature on the structure of the extended portion have been proposed. For example, methods are disclosed in the official gazette of the Japanese Unexamined Patent Publication No. 2003-91706, and No. Hei-11-99779.

In the PC card described in the above Publication No. 2003-91706, fixation of the lid into the extended portion of a synthetic resin case constituting the case of the PC card is actualized with a non-openable fit-and-fixed structure of a locking mechanism having a hook in the longitudinal direction of the PC card. In this case also, the resin molding of the extended portion and the lid is inevitably complicated.

Also, according to the above Publication No. Hei-11-99779, the PC card has a structure such that the lid to cover the extended portion is pressed by an end portion of a decorative panel, when the decorative panel is fit to the main portion with a screw.

SUMMARY OF THE INVENTION

Accordingly, in consideration of the prior art described above, it is an object of the present invention to provide a PC card which reduces possibility of the lid being detached from the extended portion even when twisting stress, bending stress, etc. is applied against the PC card, and simplifies the metal mold for resin molding.

According to the present invention to attain the aforementioned object, as a first aspect, there is disclosed a PC card which is inserted to an electronic apparatus and electrically connected thereto, and performs a predetermined function. The PC card includes a main portion having one side inserted to the electronic apparatus for electric connection, an extended portion being extended to the opposite side of the main portion to the electric connection side, and a lid covering the extended portion. The extended portion and the lid include a plurality of pairs of catches respectively disposed in the same positions on the side walls in parallel with the insertion direction to the electronic apparatus, with deviations in the height direction of the side walls. By placing the lid so as to face the extended portion in such a way that the catches provided on the lid are evaded from the catches provided on the extended portion, and thereafter sliding the lid relatively against the extended portion in parallel with the insertion direction to the electronic apparatus, the catches on the lids and the catches on the extended portion become aligned in the height direction, and thereby the lid is fixed to the extended portion.

As a second aspect of the PC card according to the present invention to attain the aforementioned object, in the first aspect, the main portion and the extended portion are structured so as to accommodate a common board having circuit components mounted thereon.

As a third aspect of the PC card according to the present invention to attain the aforementioned object, in the first aspect, the main portion forms a frame body. The frame body includes a concave-and-convex portion at the end of the boundary to the extended portion, while the lid includes a convex-and-concave portion fitted to the concave-and-convex portion provided on the frame body of the main portion. When the lid is placed facing to the extended portion, and slid in parallel with the insertion direction to the electronic apparatus, the above-mentioned concave-and-convex portion is fitted to the convex-and-concave portion, thereby providing a temporary stopper function to prevent the lid from moving back to the opposite direction to the slide direction.

As a fourth aspect of the PC card according to the present invention to attain the aforementioned object, in the third aspect, a lid includes a concave in a position nearer to the extended portion than the convex-and-concave portion, and further a decorative panel covering the main portion. The decorative panel includes a protrusion at the end, which is stopped by the concave of the lid.

Further scopes and features of the present invention will become more apparent by the following description of the embodiments with the accompanied drawings.

BRIEF DESCRIPTION OF THE DRAWINGS

FIGS. 5A to 5E show the assembly process of PC card 10 according to the present invention.

DETAILED DESCRIPTION OF THE INVENTION

The preferred embodiment of the present invention is described hereinafter referring to the charts and drawings. However, it is noted that the scope of the present invention is not limited to the embodiments described below.

Figure 1A:
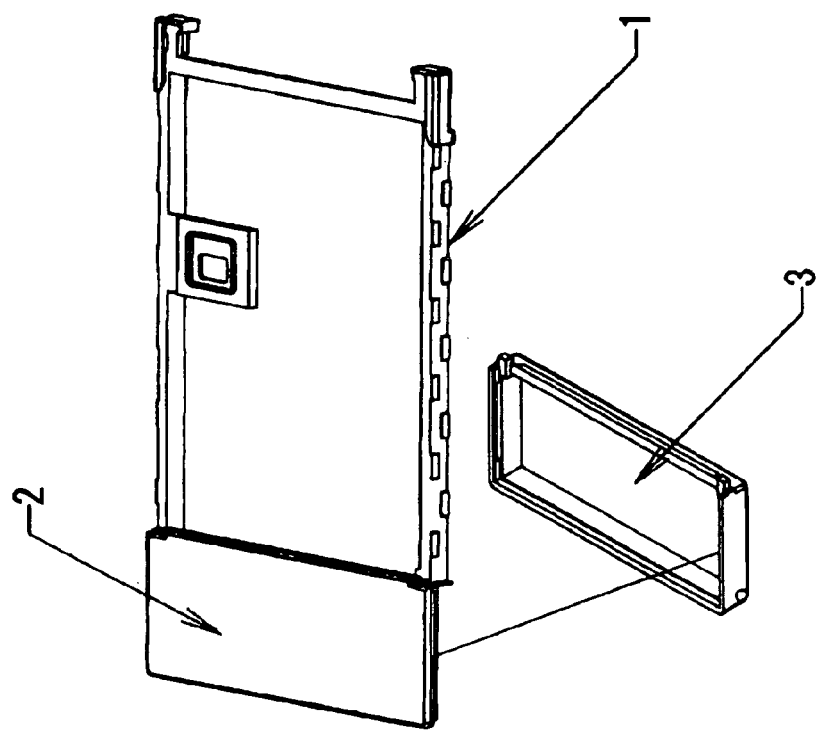
FIGS. 1A, 1B show exploded diagrams of a PC card of conventional structure.
Figure 1B:
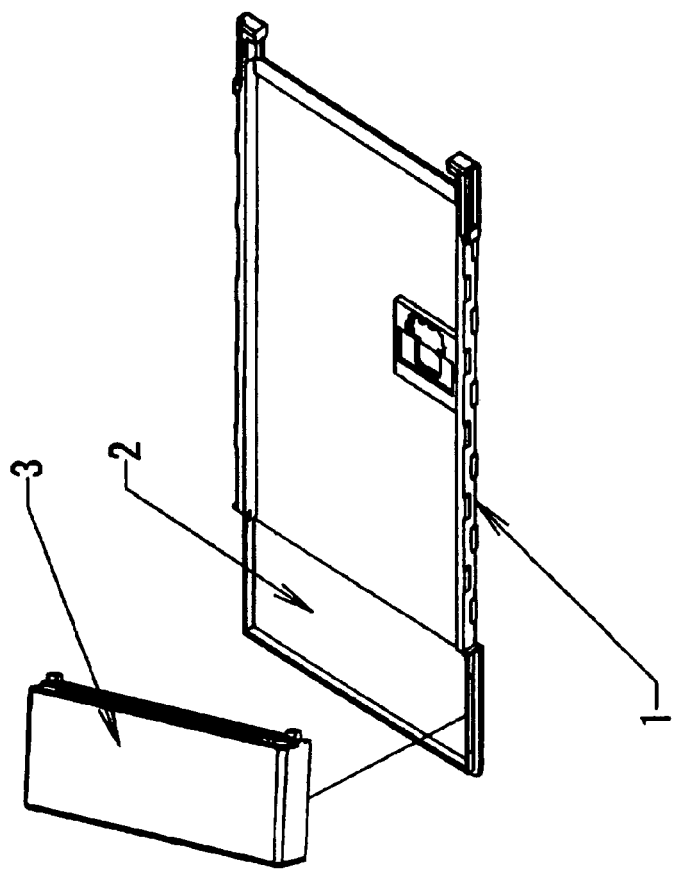
Figure 2A:
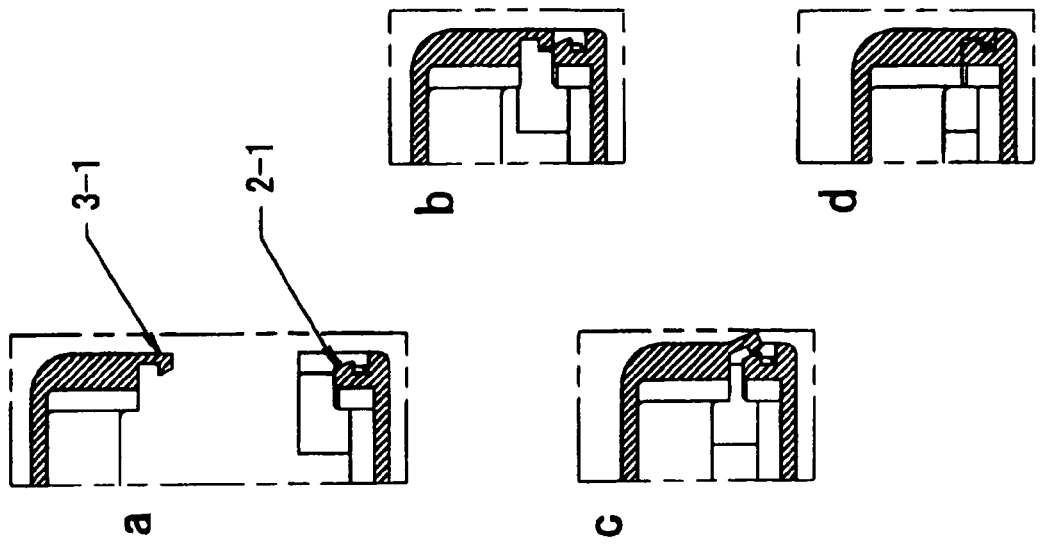
FIGS. 2A to 2C show diagrams illustrating combination of extended portion 2 with lid 3 shown in FIG. 2.
Figure 2B:
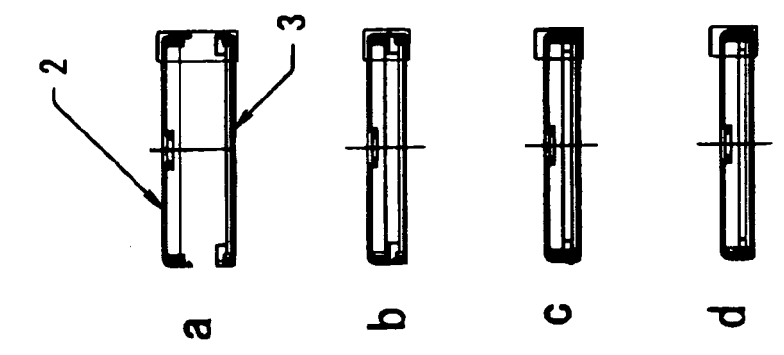
Figure 2C:
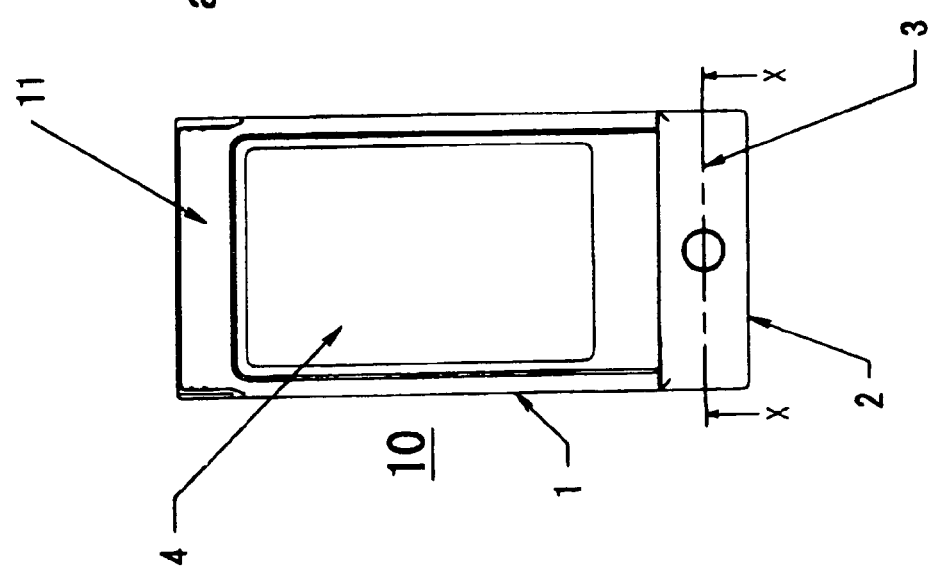
Figure 3A:
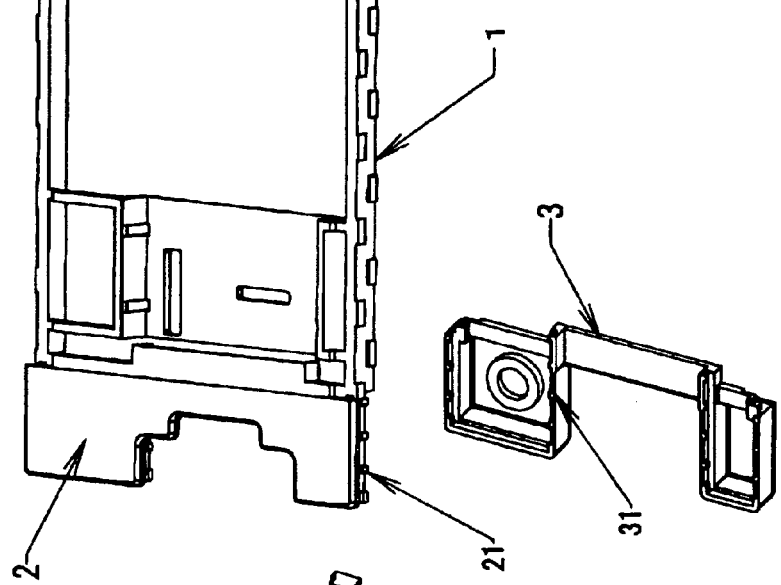
FIGS. 3A, 3B show exploded diagrams of a main portion 1 and an extended portion 2 of a PC card according to an embodiment of the present invention.
Figure 3B:
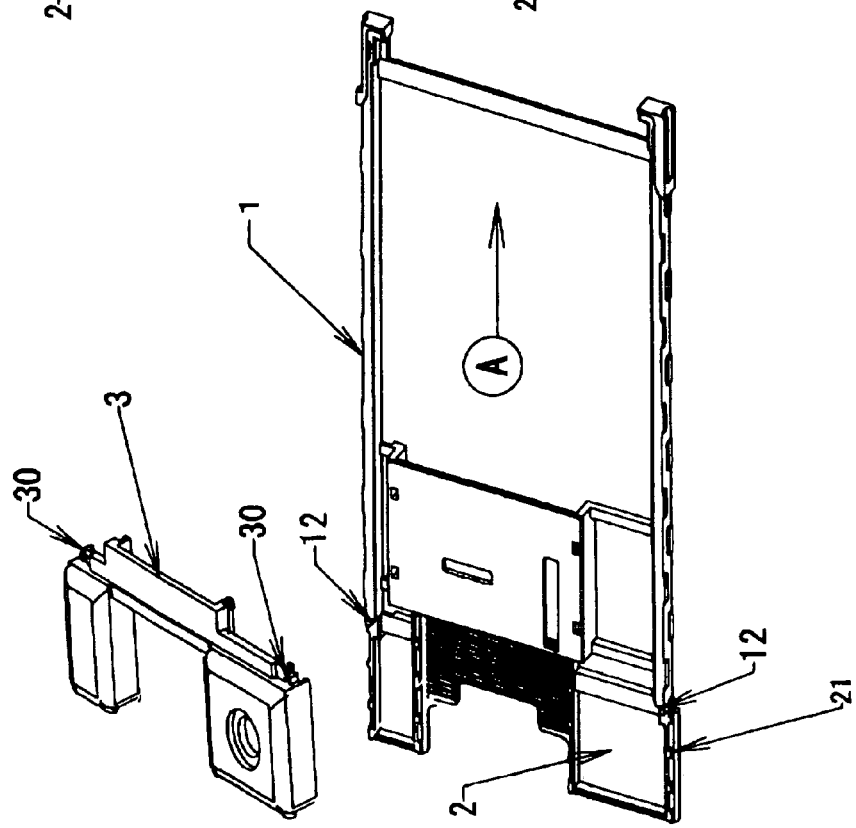

FIGS. 3A, 3B show exploded diagrams of main portion 1 and extended portion 2 of a PC card according to an embodiment of the present invention. In these figures, a circuit board having circuit components accommodated in main portion 1 and extended portion 2 is not shown.

FIG. 3A shows an upper face of the PC card, while FIG. 3B shows the opposite face. Here, the concept of the PC card according to the present invention is applicable to any PC card conforming to the PCMCIA standard. However, the PC card is not limited thereto. Namely, needless to say, the PC card structure according to the present invention is also applicable to functional cards based on various standards, such as compact flash memory cards, so far as no structural restriction exists.

Referring back to FIGS. 3A, 3B, as a feature of the present invention, first, a plurality of pairs of catches 21, 31 are provided, which are mutually disposed in the same positions on the side walls of both extended portion 2 and lid 3 along the insertion direction to the electronic apparatus (shown by an arrow A), having deviation in the height direction of the side walls.

Figure 4:
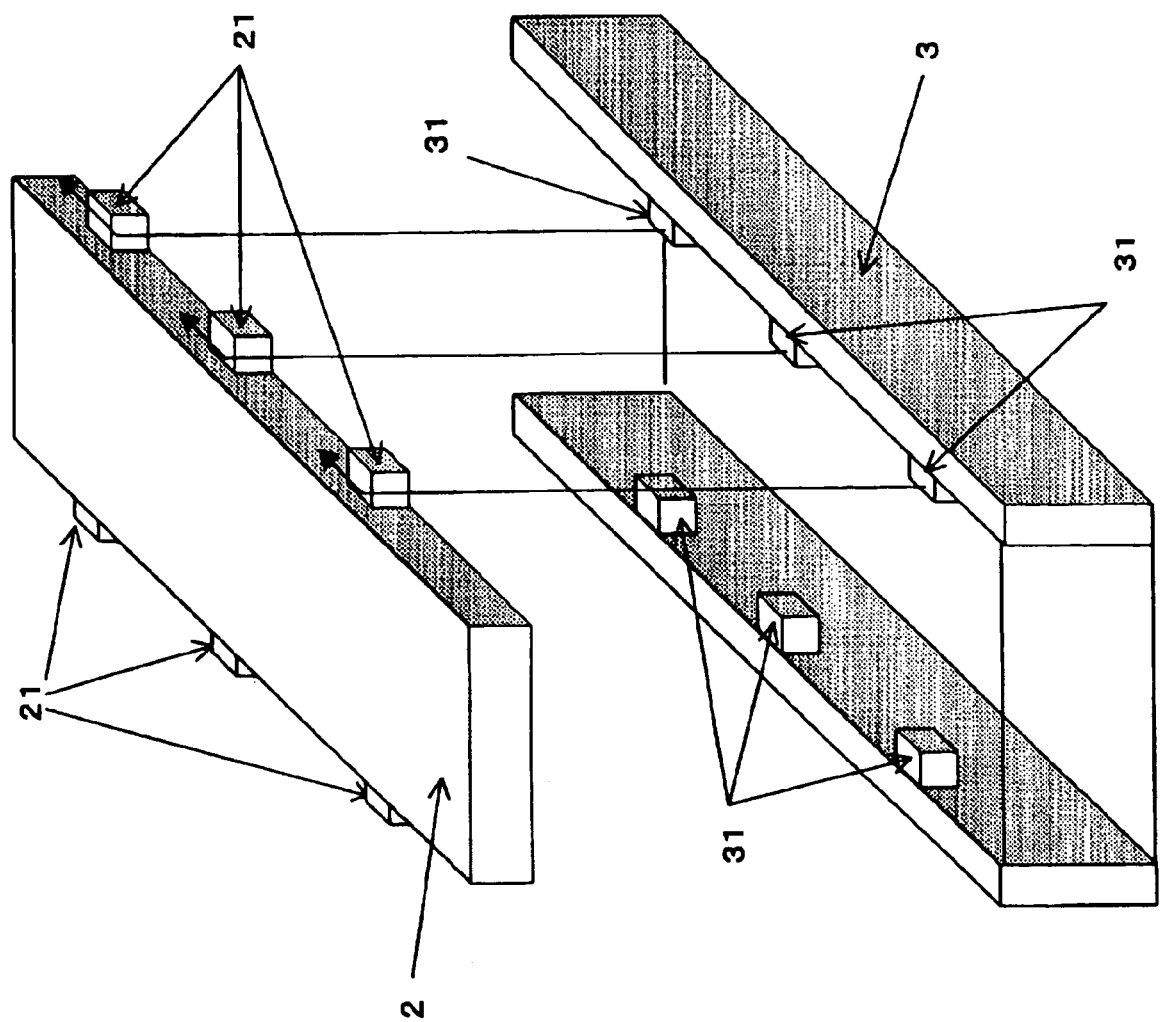
FIG. 4 shows a detailed explanation diagram of catches 21, 31 shown in FIGS. 3A, 3B.

In FIG. 4, a detailed explanation diagram of the catches 21, 31 are shown. When fixing lid 3 to extended portion 2, first lid 3 is placed facing to the extended portion 2, in such a way that the positions of catches 31 provided on lid 3 is evaded from the positions of the catches provided on the extended portion. Next, by relatively sliding lid 3 against extended portion 2 in the direction shown by arrows of which tops filled with black, namely, along the insertion direction to the electronic apparatus, catches 31 provided on lid 3 and catches 21 provided on extended portion 2 become aligned in the height (i.e. thickness) direction of the PC card. With this, lid 3 becomes fixed to extended portion 2.

At this time, catches 21, 31 are constituted of the plurality of pairs. Accordingly, a plurality of fixing points can be provided between lid 3 and extended portion 2, enabling securer fixing compared with the conventional example described earlier.

Moreover, as another feature of the invention, both sides of the frame body of main portion 1 include concave-and-convex portions 12 at the end of the boundary to extended portion 2. Also, lid 3 includes convex-and-concave portions 30, which is structured to fit to concave-and-convex portions 12 provided on the frame body of main portion 1. As will be described later in the explanation of an assembly process, by fitting concave-and-convex portions 12 to convex-and-concave portions 30, a temporary stopper function can be obtained when fixing lid 3 to extended portion 2.

FIGS. 5A to 5E show a diagram illustrating the assembly process of PC card 10 according to the present invention.

In FIG. 5A, a circuit board 100 having circuit components common to main portion 1 and extended portion 2 is accommodated. Lid 3 is provided with catches 31 on both side walls in parallel with the insertion direction (arrow 200) to the electronic apparatus. Also, extended portion 2 is provided with catches 21 in the positions corresponding to catches 31.

As illustrated in the enlarged circle shown in FIG. 5B, lid 3 is placed facing extended portion 2, in such a way that catches 31 provided on lid 3 is evaded from corresponding catches 21 provided on extended portion 2. Next, lid 3 is slid in the direction shown by an arrow 201. Thus, catches 21 and catches 31 are positioned in alignment in the height (thickness) direction, and lid 3 is fixed to extended portion 2.

Here, the fixing of lid 3 to extended portion 2 is a mechanism of fixing in the vertical direction only. Therefore, fixing in the slide direction is further necessary. According to the present invention, as having been illustrated in FIG. 3A, main portion 1 is provided with concave-and-convex portions 12, each having a concave 121 and a convex 122 at the end of the boundary to extended portion 2. Also, lid 3 is provided with convex-and-concave portions 30, each having a convex 301 and a concave 302.

Accordingly, by sliding lid 3 in the direction shown by an arrow 201, each concave-and-convex portion 12 having concave 121 and convex 122 fits into each convex-and-concave portion 30 having convex 301 and concave 302, as illustrated in the partially enlarged diagram shown in FIG. 5C. This mechanism enables stopping lid 3 temporarily, so as to prevent lid 3 from sliding back in the opposite direction to the direction shown by arrow 201.

Further, lid 3 has a concave 303 in a position nearer to the extended portion 2 side than the above-mentioned convex-and-concave portion 30.

A protrusion 41 formed on a decorative panel 4 is inserted into the above concave 303. As shown in FIG. 5D, decorative panel 4 is stuck on both front and rear faces of main portion 1, so as to cover the entire circuit board mounted on main portion 1.

At this time, protrusion 41 provided at the end of decorative panel 4 is stopped by concave 303. This prevents concave-and-convex portion 12 from being detached from convex-and-concave portion 30, and in consequence, prevents lid 3 from sliding in the reverse direction.

As such, the assembly of the PC card according to the present invention is completed (refer to FIG. 5e).

To summarize, the PC card according to the present invention has the following advantages. The PC card has a structure of fixing the lid to the extended portion by use of a plurality of catches formed on both the extended portion and the lid. Accordingly, the lid can be fixed against the extended portion both in the vertical and horizontal directions, enabling prevention of the lid from being detached from the extended portion even twisting or bending stress is applied to the PC card. Further, because both the extended portion and the lid have structures of being fitted by the aforementioned catches, there is no fear of the lid being deformed when fixing the lid to the extended portion.

Thus, a highly reliable PC card can be provided, which can contribute to the industry.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the claims.

What is claimed is:

1. A PC card which is inserted into an electronic apparatus in an insertion direction and is electrically connected thereto, and which performs predetermined functions, comprising:
    a main portion member having one side insertable into the electronic apparatus for electric connection;
    an extended portion being extended to an opposite side of the main portion member to the electronic connection side; and
    a lid covering the extended portion,
    the extended portion and the lid including a plurality of pairs of catches respectively disposed in same positions on side walls in parallel with the insertion direction to the electronic apparatus, with deviations in a height direction of the side walls,
    wherein by placing the lid so as to face the extended portion in such a way that the catches provided on the lid are evaded from the catches provided on the extended portion, and thereafter sliding the lid relatively against the extended portion in parallel with the insertion direction to the electronic apparatus, the catches on the lid and the catches on the extended portion become aligned in the height direction, and thereby the lid is fixed to the extended portion.

2. The PC card according to claim 1,
    wherein the main portion and the extended portion accommodate a common board having circuit components mounted thereon.

3. The PC card according to claim 1,
    wherein the main portion forms a frame body, which includes a concave-and-convex portion at the end of the boundary to the extended portion, and the lid includes a concave-and-convex portion fitted to the concave-and-convex portion provided on the frame body of the main portion, and
    wherein when the lid is placed facing to the extended portion, and slid in parallel with the insertion direction to the electronic apparatus, the above-mentioned concave-and-convex portion is fitted to the concave-and-convex portion, thereby providing a temporary stopper function to prevent the lid from moving back to the opposite direction to the slide direction.

4. The PC card according to claim 3,
    wherein the lid includes a concave in a position nearer to the extended portion than the concave-and-convex portion, and further a decorative panel covering the main portion, and the decorative panel includes a protrusion at the end, which is stopped by the concave of the lid.

5. An electronics card, comprising:
    a main portion including an insertion portion located adjacent a first end thereof, said insertion portion being insertable along an insertion direction into receptacle of an electronic apparatus in a manner establishing an electrical connection therewith;
    an extended portion which is extended from a second end of said main portion opposite to said first end, said extended portion including extended portion side walls, extended portion catches being disposed along said extended portion side walls co-directionally aligned with the insertion direction; and
    a lid configured to overlay a face of the extended portion, said lid including lid side walls on which lid catches are carried which are selectively brought in and out of engaging alignment with said extended portion catches by slidable movement of said lid relative to said extended portion generally in the insertion direction which blocks removal of the lid from the extended portion in a direction orthogonal to the insertion direction.

6. The electronics card according to claim 5, wherein said extended portion catches are deviated in height positions from corresponding height positions of said lid catches in a thickness direction when said lid is received to said extended portion to allow clearance therebetween when said lid is slidably moved relative to said extended portion generally in said insertion direction when contactably facing one another.

7. The electronics card according to claim 1, wherein the main portion and the extended portion accommodate a common board having circuit components mounted thereon.

8. The electronics card according to claim 1, wherein each of said extended portion side walls includes at least two of said extended portion catches and each of said lid side walls includes at least two of said lid catches spaced apart from one another generally in the insertion direction.

9. The electronics card according to claim 1, wherein said lid includes lid convex-and-concave portions engageable with main portion convex-and-concave portions carried on said main portion at a boundary thereof with said extended portion when said lid is slidably moved to a position of said engaging alignment of said lid catches with said extended portion catches.

10. The electronics card according to claim 1, further comprising a panel which engages the main portion, said lid including a concavity formed in a position nearer to the second end than said lid convex-and-concave portions, said panel including a protrusion insertable into said concavity thereby preventing slidable displacement of said lid from said extended portion.

* * * * *